US006513622B1

(12) United States Patent
Gelow et al.

(10) Patent No.: US 6,513,622 B1
(45) Date of Patent: Feb. 4, 2003

(54) FULL-RANGE LOUDSPEAKER SYSTEM FOR CINEMA SCREEN

(75) Inventors: William J. Gelow, Thousand Oaks, CA (US); Bernard M. Werner, Los Angeles, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 09/645,006

(22) Filed: Aug. 23, 2000

Related U.S. Application Data

(60) Provisional application No. 60/163,137, filed on Nov. 2, 1999.

(51) Int. Cl.[7] .................................................. H05K 5/00

(52) U.S. Cl. ....................... 181/152; 181/159; 181/189; 181/199; 381/82; 381/182; 381/345

(58) Field of Search ................................ 181/148, 152, 181/154, 159, 163, 187, 189, 185, 191, 30, 199; 381/82, 97, 182, 339, 342, 351, 345, 348

(56) References Cited

U.S. PATENT DOCUMENTS

| | | | | | |
|---|---|---|---|---|---|
| 3,645,355 | A | * | 2/1972 | Long | 181/147 |
| 4,237,340 | A | * | 12/1980 | Klipsch | 381/99 |
| 4,295,026 | A | * | 10/1981 | Tanaka et al. | 381/99 |
| 4,569,076 | A | * | 2/1986 | Holman | 181/151 |
| 4,580,655 | A | * | 4/1986 | Keele, Jr. | 181/187 |
| 4,583,245 | A | * | 4/1986 | Gelow et al. | 381/100 |
| 5,000,286 | A | * | 3/1991 | Crawford et al. | 181/145 |
| 5,004,067 | A | * | 4/1991 | Patronis | 181/188 |
| 5,020,630 | A | * | 6/1991 | Gunness | 181/187 |
| 5,140,460 | A | * | 8/1992 | Fukuhara et al. | 359/445 |
| 5,185,801 | A | * | 2/1993 | Meyer et al. | 381/59 |
| 5,302,917 | A | * | 4/1994 | Concorso | 330/264 |
| 6,009,182 | A | * | 12/1999 | Gunness | 381/182 |
| 6,016,353 | A | * | 1/2000 | Gunness | 181/145 |
| 6,112,847 | A | * | 9/2000 | Lehman | 181/152 |

FOREIGN PATENT DOCUMENTS

| | | | | | |
|---|---|---|---|---|---|
| JP | 54160226 | A | * | 12/1979 | H04R/1/26 |
| JP | 2000010193 | A | * | 1/2000 | G03B/21/56 |

* cited by examiner

*Primary Examiner*—Robert E. Nappi
*Assistant Examiner*—Edgardo San Martin
(74) *Attorney, Agent, or Firm*—Sonnenschein Nath & Rosenthal

(57) ABSTRACT

A full-frequency-range cinema loudspeaker system intended or deployment in limited space behind a perforated cinema screen is configured as three modules: (1) a high-frequency module having a compression driver working into a horn-shaped waveguide that is specially shaped to compensate for beam-spreading effects of the perforated screen, (2) a midrange module providing a specially shaped waveguide with a multiple throat portion that mounts four cone-type drivers in a vertical array, the four individual throat regions merging into a common mouth portion of the waveguide that flares out to the front of the module, and (3) a vented-port low-frequency module with two cone-type low-frequency loudspeaker units. The three modules are stacked with the high-frequency module on top and the low-frequency module at bottom; The modules are all made to have a uniform width and a depth of under eighteen inches. Each module is designed to provide uniform sound coverage throughout its designated audio frequency range and throughout a target auditorium area of the theater, including smooth and seamless crossovers between the ranges. In the midrange module, vertical beamwidth is held substantially constant by signal processing provided by an electrical filter network that results in a constant vertical polar response pattern independent of frequency To provide optimal coverage, the waveguides in the high-frequency and midrange modules are specially shaped and directed downwardly at a selected angle of 5 degrees. Additionally, mechanism is provided for tilting the midrange and high-frequency modules if necessary to accommodate a tilted screen.

19 Claims, 16 Drawing Sheets

| | |
|---|---|
| Waveguide length = k | (Length of waveguide) |
| Throat offset = d | (Adjust the sidewall tangent angle) |
| Throat radius = a | (Exit diameter) |
| Target horz. coverage = $\Theta_1$ | (1/2 angle) |
| Target vert. coverage = $\Theta_2$ | (1/2 angle) |

$$\Theta_0 = \mathrm{Tan}^{-1}\left([(\tan\Theta_1)(\tan\Theta_2)]^{1/2}\right)$$

$$\propto = \frac{\mathrm{Tan}\Theta_1}{\mathrm{Tan}\Theta_2}$$

$$r(x) = a^2 + (\mathrm{Tan}^2\Theta_0)(x^2)$$

$$b(x) = r(x)\left[1 + \frac{(\propto - 1)(x-d)}{R}\right]^{1/2}$$

$$c(x) = r(x)\left[1 + \frac{(\propto - 1)(x-d)}{R}\right]^{-1/2}$$

curves that define wall section views as a function of axial position "x".

$$\vec{b} = \begin{bmatrix} b(x) \\ o \end{bmatrix} \quad \longleftarrow \text{horz. section}$$

$$\vec{c} = \begin{bmatrix} o \\ c(x) \end{bmatrix} \quad \longleftarrow \text{vert. section}$$

$$\vec{d} = \left(\frac{R-x}{R} + 1\right)^{1/2} \begin{bmatrix} b(x) \\ c(x) \end{bmatrix} \quad \longleftarrow \text{diagonal section}$$

where $\vec{b} = \vec{b}\,(y,z)$ $\vec{c} = \vec{c}\,(y,z)$ $\vec{d} = \vec{d}\,(y,z)$

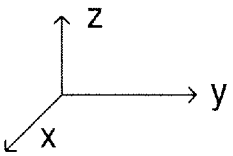

ie:

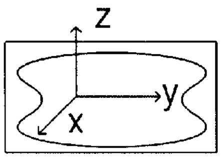

*FIG. 6*

FULL-RANGE LOUDSPEAKER SYSTEM FOR CINEMA SCREEN

PRIORITY

Benefit is claimed under 35 U.S.C. §119(e) of pending provisional application No. 60/163,137 filed Nov. 2, 1999.

FIELD OF THE INVENTION

The present invention relates to the field of cinema sound systems and more particularly it relates to an improved full-frequency-range loudspeaker array in a modular system for providing defined full audience coverage in a theater where the system is deployed behind a conventional perforated cinema screen.

BACKGROUND OF THE INVENTION

The requirements for a cinema loudspeaker system can be stated simply: to provide uniform sound coverage as perceived at practically all seating locations in the theater with regard to both loudness and flatness of full frequency response, while causing the perceived sound source to coincide with the images projected on the screen, with sufficient overall efficiency to keep the total power requirements within practical limits.

Fulfilling these requirements is far from simple and requires special treatment for various portions of the total audio frequency spectrum and for various regions of the theater auditorium.

A principal design challenge in cinema sound, with the burden falling largely in the mid-frequency range, is the unusual degree of beamwidth confinement and selective control required in efforts to configure and deploy an array of loudspeakers that will satisfy the defined audience coverage requirements from the front to the back row and fully to the sides of the auditorium. Without special selective directivity, the audience coverage would be uneven, and much of the available acoustic energy would become lost, escaping to regions other than the seating area.

For defined coverage, cinema sound systems are required to provide controlled sound directivity, typically measured in a hemispherical free space to approximate the geometric conditions of anticipated final location in the front wall of a theater; the beamwidths at −6 dB coverage are typically required to be about 90 to 100 degrees horizontal by 40 to 50 degrees vertical. This beamwidth is a function of the loudspeaker system design at all frequencies down to about 250 Hz; below this, sound inherently becomes increasingly non-directional as the frequency decreases.

The system must meet the requirement of providing spatial accuracy, i.e. identifying the source of sound with differently located images on the screen. Typically this can be addressed satisfactorily by a three channel system having left, center and right vertical arrays or stacks behind the screen, however to preserve "stereo sound stage imaging" each of these stacks must be designed for defined coverage of the full theater area. Typically the three stacks are made physically identical, but they may be equalized individually for optimizing coverage and frequency response.

Since a solid screen generally require loudspeakers to be located above or below the screen, the majority of motion picture exhibitors utilize a perforated vinyl screen in order to preserve accuracy of sound sourcing by locating the loudspeaker system behind the screen. However, due to the small diameter holes, the low ratio of open area introduces frequency-dependent anomalies such as attenuation, reflections and beam spreading which degrade the audience coverage.

Frequency-dependent attenuation can be dealt with by equalization, however there are usually associated spatial anomalies that must be addressed as well.

In addition to auditorium acoustics, the region behind the screen and even the space between the screen and the speakers must be considered with regard to harmful reflections.

Beam spreading due to the screen perforations increases with frequency. FIG. 1A is a graph showing target directivity index for a cinema loudspeaker of known art, with no screen present, as being constant at 10 dB, which represents a gain at the strongest direction, typically on the major axis, relative to a omnidirectional point source of the same power. The corresponding beamwidth, shown in the curve of FIG. 1B, is seen to be constant at 100 degrees: cinema loudspeaker systems are typically designed for 90 to 100 degrees horizontal beamwidth. These target parameters have been used conventionally for design and evaluation of cinema loudspeakers with no screen present. However when deployed behind the cinema screen, the directivity index tends to decrease with increasing frequency as shown in FIG. 2A, which shows it reducing to 5 dB above 10 kHz; the corresponding beamwidth, shown in FIG. 2B, spreads to nearly double, increasing from 100 degrees to about 180 degrees which is practically omni-directional in the case of the movie theater since the sound source, i.e. the loudspeaker, is in effect mounted in one wall and thus working into a hemispherical field region.

FIGS. 3A–C are polar graphs showing horizontal directivity as provided by a conventional high-frequency module of known art measured at 2, 4 and 8 kHz respectively, with a cinema screen spaced away 2", 8", and completely removed.

FIGS. 3D–F are polar graphs showing the vertical directivity corresponding to FIGS. 3A–C.

This screen beam-spreading effect, increasing with frequency as seen here and in related FIG. 2B, wastes high-frequency audio power emanating in unwanted directions and generally degrades the high-frequency coverage of the system. It remains a problem in the attainment of required beamwidth at high-frequency for defined coverage of cinema sound systems: a problem that has not been adequately addressed in known art. Heretofore, transducer driver units, waveguides and/or stacks thereof for behind-the-screen cinema deployment have not been commercially available with capabilities to fully meet increasingly demanding requirements for defined coverage with full frequency high fidelity and space constraints: more specifically, with compensation for perforated screen spreading in the high-frequency range that increases with frequency and/or with sufficient directivity for defined coverage control in the lower mid-frequency range and/or in a sufficiently compact size for installations where there is only limited space available behind the screen, which can be as little as 18 inches.

DISCUSSION OF KNOWN ART

U.S. Pat. No. 4,569,076 to Holman for a MOTION PICTURE THEATER LOUDSPEAKER SYSTEM discloses such a system wherein the loudspeaker elements are made to be integral with an acoustical boundary wall constructed behind the screen in order to optimize the characteristics of vented bass woofers.

U.S. Pat. No. 4,580,655 to Keele Jr. discloses a DEFINED COVERAGE LOUDSPEAKER HORN wherein opposed sidewalls are constructed to direct portions of a sound beam toward a target over different preselected incident angles.

U.S. Pat. No. 5,233,664 to Yanagawa et al for a SPEAKER SYSTEM AND METHOD OF CONTROLLING DIRECTIVITY THEREOF discloses the use several different digital filters connected between a common input terminal and several speaker units arranged linearly, in a matrix or in honeycomb form.

U.S. Pat. No. 5,004,067 to Patronis for a CINEMA SOUND SYSTEM FOR UNPERFORATED SCREENS utilizes an exponential middle frequency horn, crossed-over at 150 and 600 Hz, physically combined with a constant directivity high-frequency horn, for mounting three such units above the screen while locating three direct radiator bass units at the floor position beneath the screen.

U.S. Pat. No. 5,020,630 to Gunness for a LOUDSPEAKER AND HORN THEREFOR discloses a high-frequency loudspeaker for projecting sound over a listening area having a driver and a horn in which the horn has a coupling portion communicating with an outwardly flaring portion, the horn forming an elongated slot at the interface, the slot being narrower at one end and flaring outwardly to the other end. The driver frequency range is 500–20,000 Hz, and directivity is shown at 2,000 Hz. This patent teaches a high central loudspeaker location, downwardly inclined at the front end of an auditorium; however it fails to address the particular requirements of theaters or deployment behind a cinema screen.

Speaker arrays, including electronically and/or acoustically filtered arrays have been used in known art for low-frequency pattern control, but have relatively low efficiency, limited bandwidth capability and/or excessive physical size.

OBJECTS OF THE INVENTION

It is a primary object of the present invention to provide a loudspeaker system for deployment behind a perforated cinema screen, to accomplish defined uniform sound coverage with regard to loudness and full frequency range as perceived in virtually all listening regions of a theater auditorium.

It is a further object to provide a full-frequency range loudspeaker array system having a shallow profile less than 18 inches in depth.

It is a further object to provide a modular loudspeaker system that satisfies the defined coverage requirements for a theater installation utilizing a horizontal array of several physically identical modular vertical stacks, typically three, each stack formed from separate waveguide acoustically-loaded modules, each of which is dedicated to a different portion of the frequency spectrum, and which can be manufactured, tested, marketed and/or deployed independently.

SUMMARY OF THE INVENTION

The abovementioned objects have been accomplished in the present invention in a system of modular stacks that can be deployed in multiples, typically a row of three, behind a cinema screen. Each stack constitutes a three-way vertical line array having a high-frequency module stacked on top of a multi-driver midrange module which in turn is stacked on top of a dual-driver low-frequency module. The crossover frequencies are 250 Hz and 1.2 kHz.

The high-frequency module utilizes a compression driver coupled to a horn waveguide with a special orientation, vertical asymmetry and three-dimensional waveguide shaping to provide controlled directivity that increases with frequency, to compensate for cinema screen spreading and to optimize defined coverage uniformity.

The midrange frequency module is an integrated multi-band waveguide assembly configured to provide a vertical array of four contiguous specially-shaped waveguide regions each driven by a cone type transducer driver. The required defined coverage is accomplished through a combination of special shaping of the waveguide directing surfaces with vertical asymmetry to provide controlled directivity vertically and horizontally, and frequency-selective filtering in a passive network that accomplishes the required overall coverage by splitting the drive power into two paths with different special transfer functions allocated to the lower two transducers as a low-frequency portion and the to the upper two transducers as a high-frequency portion of the midrange assembly. The four drivers are separated by partitions shaped with strategic spacing dimensions, each driver working into an individual waveguide throat portion, and each directed at an inclined angle downwardly from horizontal, to optimize defined coverage uniformity. The throat portions combine smoothly into a common flared mouth portion which extends to the substantially rectangular shape of the front outline of the midrange module.

The low-frequency module is a vented bass enclosure deploying a vertical stack of two 15" cone type transducers with response extending down to 30 Hz at −6 dB.

The resulting cinema loudspeaker system provides high efficiency, high sound level capability and well-controlled coverage, compensated for screen spreading at high-frequency, and maintained substantially constant for beamwidth over the high and midrange frequency range (16 kHz to 250 Hz) in both vertical and horizontal directions. Beamwidth as well as amplitude response are matched at the 250 Hz and 1.2 kHz crossover frequencies for seamless acoustic integration of the three modules. The combination of a waveguide designed for use with a filtered line array with a well-designed filtered line provides significantly better performance than current designs.

BRIEF DESCRIPTION OF THE DRAWINGS

The above and further objects, features and advantages of the present invention will be more fully understood from the following description taken with the accompanying drawings in which:

FIG. 6 presents the mathematical basis of the waveguide wall shape in the midrange and high-frequency modules of the cinema loudspeaker array embodiment of the present invention.

DETAILED DESCRIPTION

FIGS. 1A–3F have been discussed above in connection with the background of the invention.

Figure 1A:
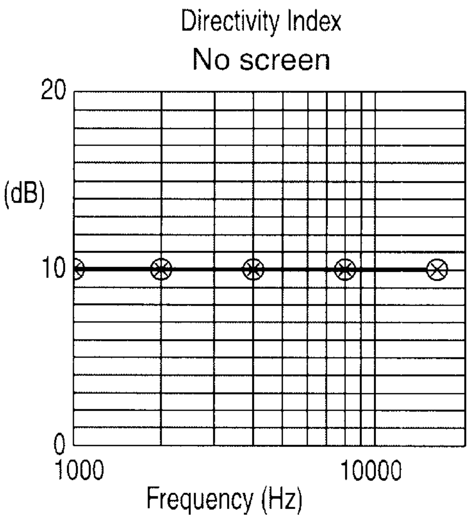
FIG. 1A PRIOR ART
FIG. 1A is graph showing the target flat frequency response of the horizontal directivity index of a conventional high-frequency cinema loudspeaker unit, with no cinema screen present.
Figure 2A:
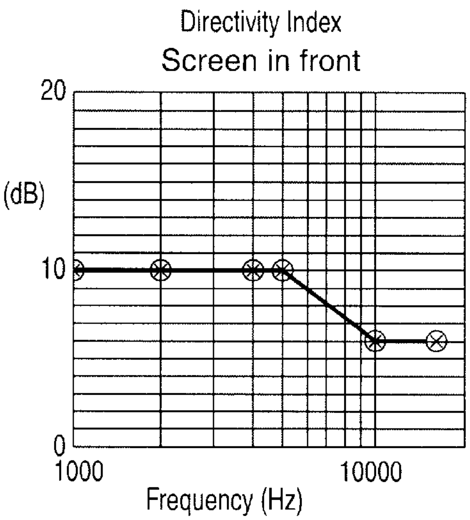
FIG. 2A PRIOR ART
FIG. 2A is a graph showing typical frequency response of horizontal directivity index for a conventional high-frequency cinema loudspeaker as in FIGS. 1A and 1B when it is deployed behind a perforated cinema screen.
Figure 1B:
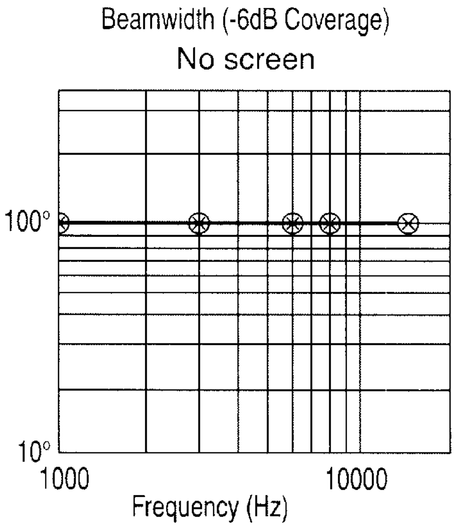
FIG. 1B PRIOR ART
FIG. 1B is a graph with a curve showing horizontal beamwidth at −6 dB coverage corresponding to the directivity curve shown in FIG. 1A.
Figure 2B:
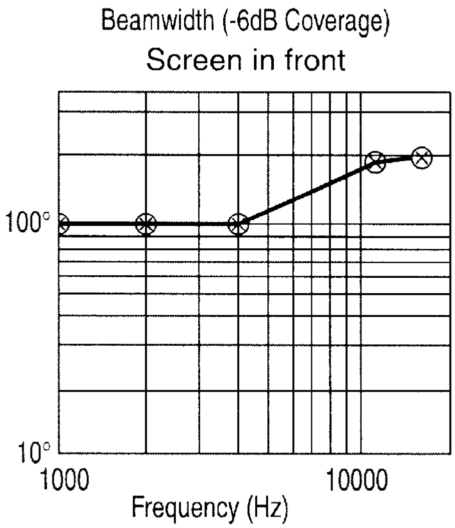
FIG. 2B PRIOR ART
FIG. 2B is a graph showing the frequency response of horizontal beamwidth at −6 dB coverage corresponding to the directivity curve shown in FIG. 2A.
Figure 3A:
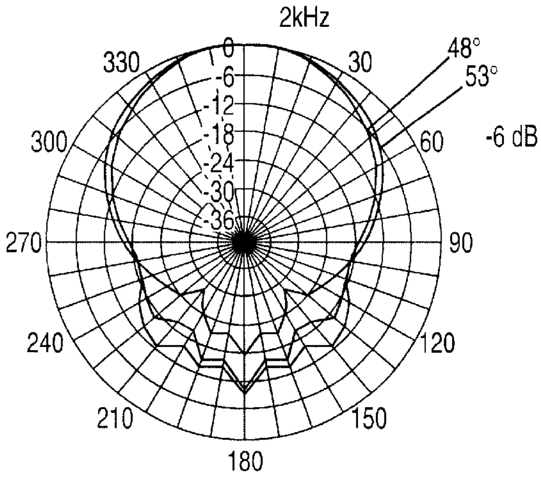
FIG. 3A PRIOR ART
FIGS. 3A–C are polar graphs showing horizontal directivity as measured on a conventional cinema loudspeaker of FIGS. 1 and 2 measured at 2, 4 and 8 kHz, with the cinema screen spaced 2", 8" and removed.
Figure 3B:
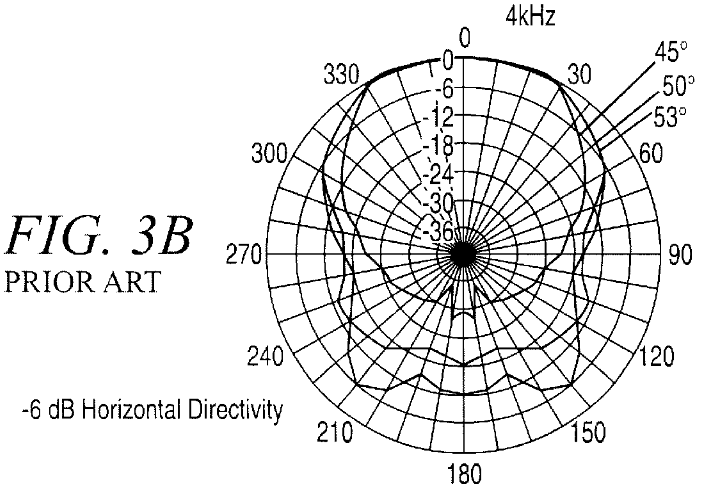
FIG. 3B PRIOR ART
Figure 3C:
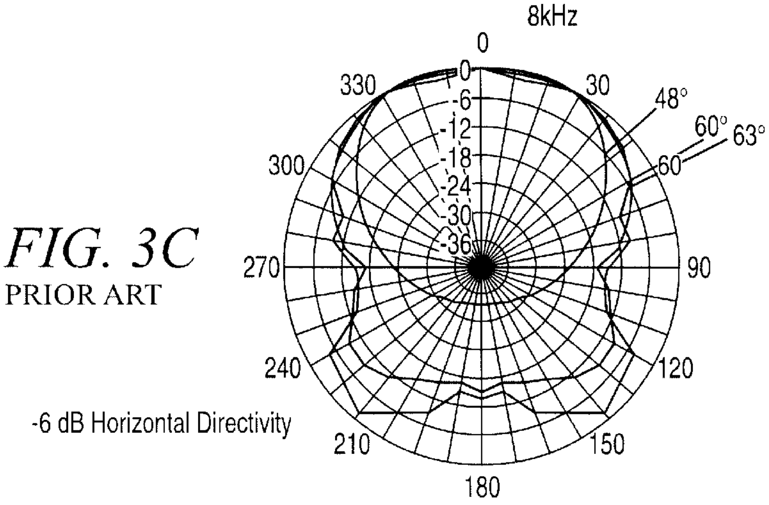
FIG. 3C PRIOR ART
Figure 3D:
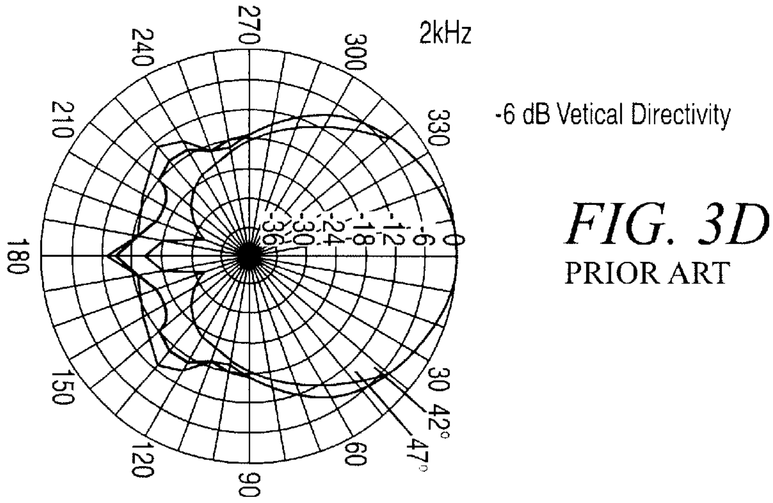
FIG. 3D PRIOR ART
FIGS. 3D–F are polar graphs showing vertical directivity corresponding to FIGS. 3A–C.
Figure 3E:
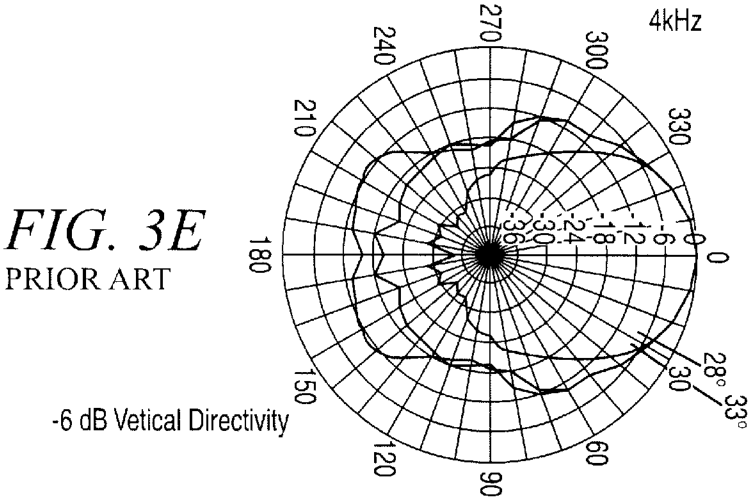
FIG. 3E PRIOR ART
Figure 3F:
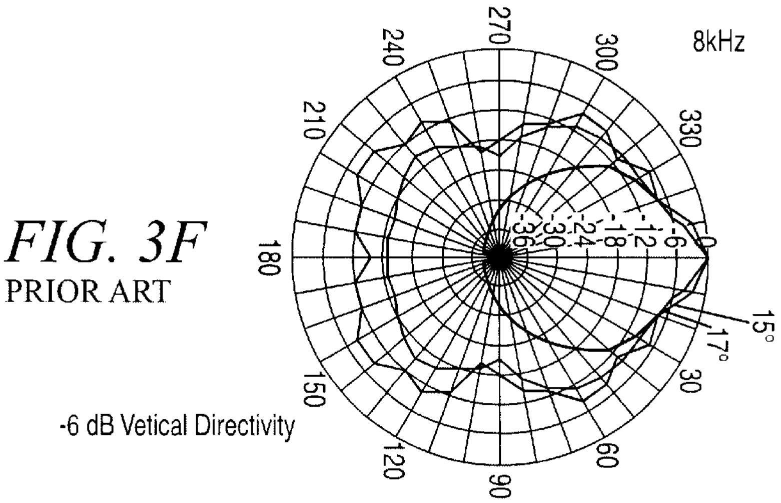
FIG. 3F PRIOR ART
Figure 4A:
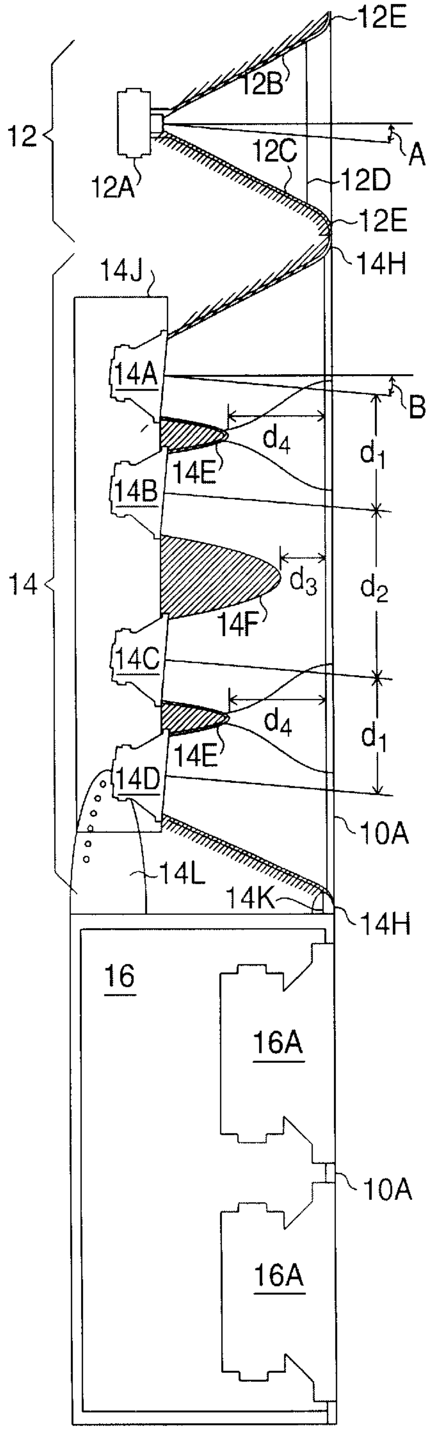
FIG. 4A is a functional diagram showing a cross-sectional side view through a central plane of the full frequency range loudspeaker array embodiment of the present invention.

FIG. 4A is a functional diagram showing a cross-sectional side view through a central plane of the full frequency range linear loudspeaker array 10 in an embodiment illustrative of the present invention. Three modules of uniform width and maximum depth dimensions are stacked to form the vertical array; each module is rear-enclosed to contain the back wave and prevent reflections between the screen and the rear cinema wall. The front plane 10A fits closely near the cinema screen typically separated by a spacing in the range of 2 to 8 inches.

In the high-frequency module 12, at the top, a high-frequency driver 12A is coupled to a waveguide with asymmetric upper and lower walls 12B and 12C as shown, extending to a transitional plane 12D where the flare increases to an opening at the front plane 12E, extending as a flange in region 12F. The waveguide is dimensioned to be effective down to 600 Hz, i.e. one octave below the 1.2 kHz crossover frequency, and, as a departure from known art, is specially shaped to increase in directivity with increasing frequency to counteract screen spreading. The cross-sectional area increases from the driven end at driver 12A to a vertical transitional plane 12D located at approximately 90% of the total waveguide length, where the flare shape transitions in a smooth tangential manner to a greater curvature extending tangentially to the exit opening at the vertical front plane 12E, where a flat surface 12F extends vertically to the top of the enclosure of module 12. The walls of the waveguide are shaped in a special and novel manner so as to cause an increase in directivity, i.e. a decrease in beamwidth, with increasing frequency, in order to compensate for beam spreading caused by the perforated cinema screen.

The vertical asymmetry of the waveguide shape causes the central axis to incline downwardly at an angle A, which is made to be 5 degrees in a preferred embodiment, so as to co-operate with the waveguide shape in accomplishing the defined coverage in typical theaters.

The high-frequency module 12 operates in a frequency range from the crossover frequency of 1.2 kHz up to 20 kHz at −6 dB with a rated power-handling capability of 50 watts AES; the recommended amplifier capability is 200 watts.

The high-frequency module 12 is made 762 mm×450 mm max×381 mm high (30"×17.75" max×15").

The midrange module 14 is a four element vertical array driven by four identical cone-type transducer drivers 14A–D, typically round units within a size range of 6.5 to 12 inches in diameter with a power-handling capability of 100 watts each.

Drivers 14A–D are each mounted on a mounting surface that is inclined downwardly at an angle B at the rear of the multiple waveguide assembly which provides a separate waveguide for each driver. As seen in the vertical cross-section, drivers 14A–B and 14C–D are separated by a center-to-center distance d1 and share a partition 14E with a cone-shaped cross-section as shown, whose opposite sides forms a waveguide surface for each, the other waveguide surface extending to the front plane 12E. Drivers 14B–C are separated by a greater center-to-center distance d2 and share a larger partition 14F which extends to a point set back from the front plane 10F by dimension d3, while partitions 14E are set back by a greater distance d4.

The four drivers are open-basket round units and are enclosed at the rear by a common cover 14J that confines the rear acoustic radiation.

Drivers 14A–B work together as an upper midrange portion driven from a branch of a filter network, and drivers 14C–D work together as lower midrange portion separately driven from a different branch of the filter network. While each of the these portions could be implemented by a single driver unit, the preferred embodiment deploys two in each portion for greater power handling capability and pattern control down to 250 Hz: the low midrange crossover frequency.

The required directivity of the four-speaker array in the midrange module 14 for defined coverage is accomplished by the shaping of the four waveguides and by the dimensioning of d1–4 and the downward mounting angle of the drivers. In a preferred embodiment of the midrange module 14, d1 is made 7.75", d2 is made 11.25", d3 is made 3", d4 is made 6.5", and the downward driver mounting angle B is made 5 degrees. the same as in the high-frequency module 12.

The midrange module 14 operates between the crossover frequencies 250 Hz and 1.2 kHz with a rated power-handling capability of 400 watts AES; the recommended amplifier power capability is 600 watts.

For the midrange module 14, the outside dimensions are 762 mm×450 mm max×1143 mm high (30"×17.75" max×45").

The high-frequency module 12 and the midrange module 14 are attached rigidly to each other at the front, and the midrange module 14 is attached to the top of the low-frequency module 16 with a pair of pivots 14K near the front, and a pair of adjustable support members 14L attached to cover 14J at the rear. Support members 14L are provided with a series of attachment holes so that, as an option to the normal condition with the front of the three modules in a common vertical plane, the attachment to cover 14J can be altered to support the high/midrange assembly at a selection of + or − inclined angles relative to the low-frequency module.

As a further option, one or more of the drivers 14A–D could be mounted in a manner to make the mounting angle B different than 5 degrees and/or to make angle B adjustable individually for on-site coverage optimization.

The low-frequency module 16 contains two 15" cone type transducers 16A in a vented port configuration with a rated power-handling capability of 800 watts AES; the recommended amplifier capability is 1200 watts. The low-frequency module 16 operates from the crossover frequency of 250 Hz down to 40 Hz at −3 dB, and 30 Hz at −6 dB.

The enclosure of the low-frequency module 16 is made 762 mm wide×450 mm deep×883 mm high (30"×17.75"×34.75").

Figure 4B:
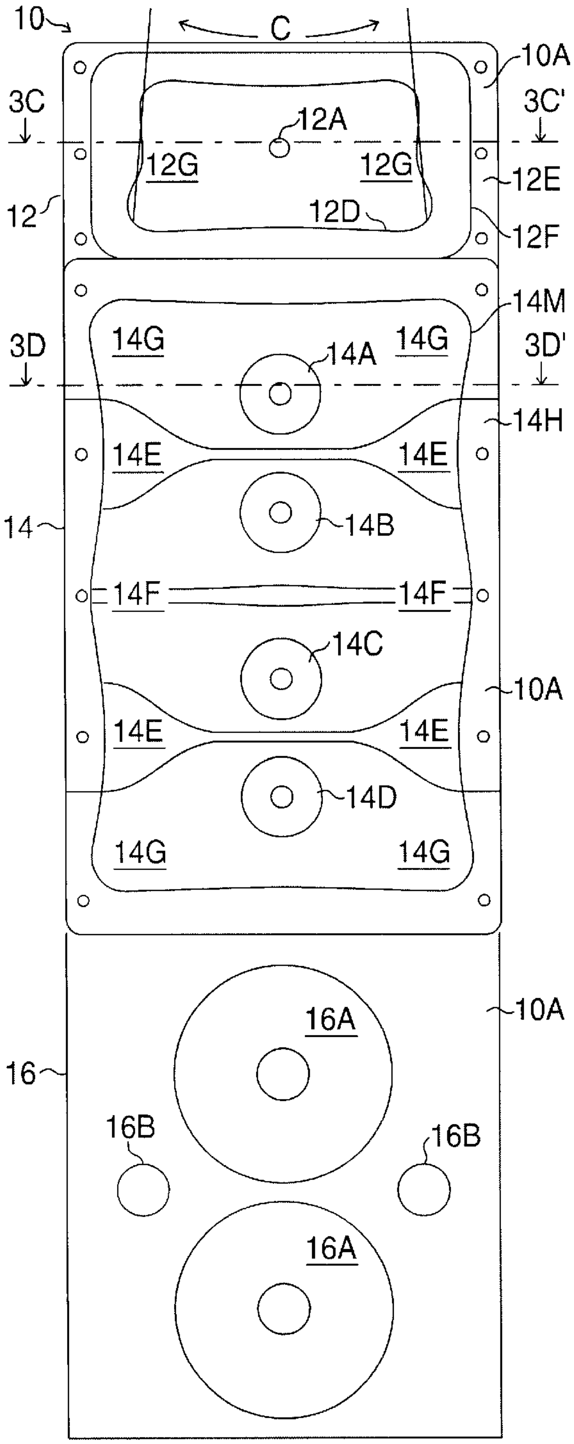
FIG. 4B is a functional diagram showing a front view of the loudspeaker array of FIG. 4A.

FIG. 4B is a functional diagram showing a front view of the loudspeaker array 10 of FIG. 4A.

In the high-frequency module 12, the front elevational view shows the cross sectional shape of the waveguide. At the driven end the shape is a circle of 1" or 1.5" diameter for engaging a conventional compression driver 12A. The waveguide shape evolves smoothly to the transitional plane 12D, where the cross-sectional shape is "keystone"-like with the sidewalls 12G and 12H bowed inwardly and inclined so as to become narrower at the top by a varying upwardly-converging angle B as shown: this shape is key to the attainment of the desired overall uniform high-frequency coverage pattern, including compensation for screen spreading effect as described above.

In the midrange module 14 it is seen that sidewalls 14G extend from the two vanes 14E and the central vane 14F to a front opening 14M flanked by flat flange surfaces 14H at the front plane 10A, in a manner to form for each driver a waveguide that extends in a symmetrical flare to the front corners of the enclosure of module 16, and flares vertically to either the enclosure top/bottom front corner or to the front extremity of a corresponding vane 14E.

In the low-frequency module 16, the locations fo the two low-frequency transducers 16A and their circular bass reflex vents 16B are shown.

Figure 4C:
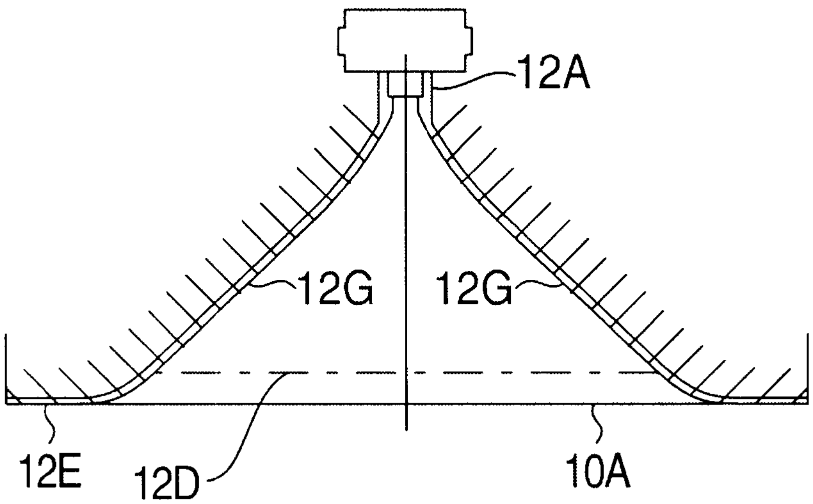
FIG. 4C is functional diagram showing a cross-sectional view of the high-frequency module taken at horizontal axis 4C–4C' of FIG. 4B.

FIG. 4C is an enlarged cross-sectional view of the high-frequency module 12 taken at horizontal axis 3C–3C' of FIG. 4B showing the two waveguide sidewalls 12G to be symmetrical and to diverge in a smooth curvature from driver 12A to a front opening 12F flanked by flange surfaces 12E at the front plane 10A.

Figure 4D:
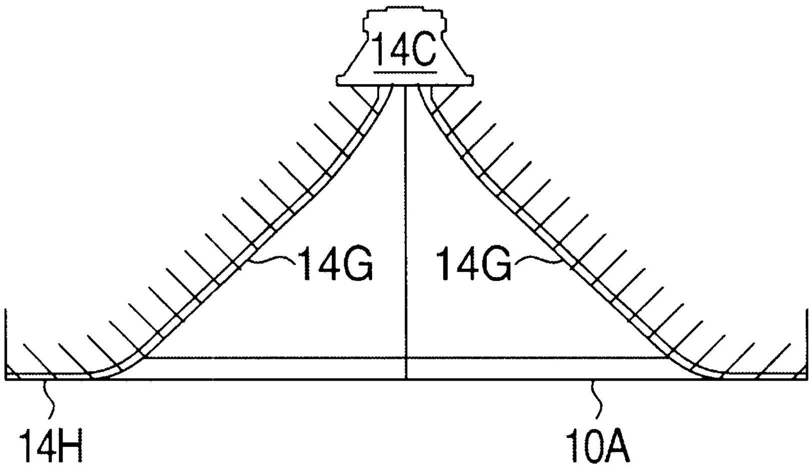
FIG. 4D is functional diagram showing a cross-sectional view of the mid-range module taken at horizontal axis 4D–4D' of FIG. 4B.

FIG. 4D is an enlarged cross-sectional view of a waveguide in the mid-range module 14 taken at horizontal axis 3D–3D' of FIG. 4B, showing the two sidewalls 14G to be symmetrical and to diverge in a smooth curvature from the cone type transducer driver 14A to an opening 14J flanked by flange surfaces 14H at the front plane 10A.

Figure 5A:
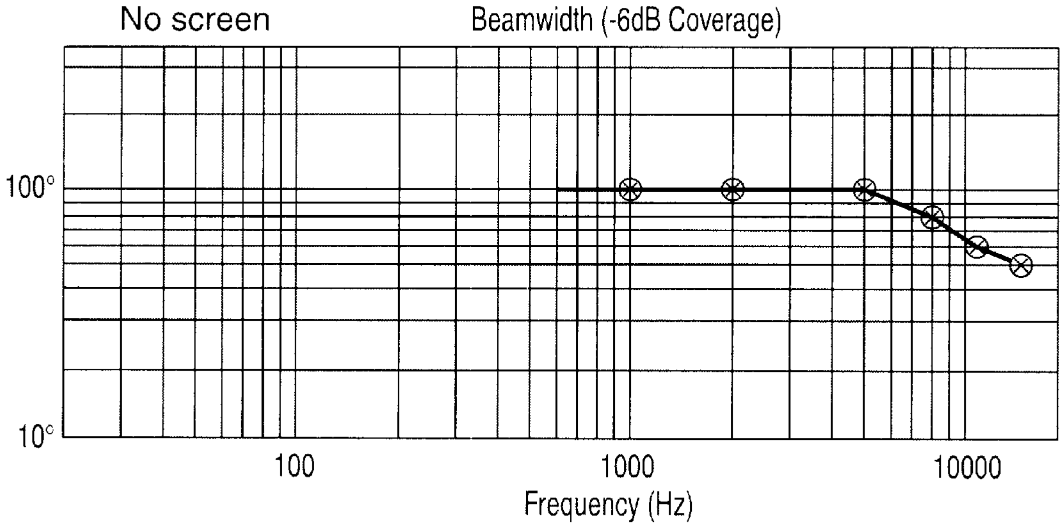
FIG. 5A is a graph showing the horizontal beamwidth at −6 dB coverage targeted for the high-frequency module of the cinema loudspeaker system of the present invention, as would be measured in a free space environment with no cinema screen present illustrating the compensation for screen spreading.

FIG. 5A is a graph showing target horizontal −6 dB beamwidth coverage as a function of frequency for the high-frequency module 12 of the cinema loudspeaker system 10 of the present invention, including compensation for screen spreading, as would be measured in a free space environment with no cinema screen present. The objective is to narrow the horizontal beamwidth, from its midrange value of 90 degrees, to 40 degrees at 16 kHz. This increase in directivity at high-frequency, a novel departure from conventional loudspeaker performance, is accomplished in the present invention mainly by configuring the shape of the waveguide in high-frequency module 12 in a manner to narrow the beamwidth (i.e. increase he directivity) with increasing frequency as shown in FIG. 5A, so that when the loudspeaker, compensated in this manner, is deployed behind a perforated screen, the resultant beamwidth will be remain substantially constant at the desired nominal value, 100 degrees, over the full frequency range.

Figure 5B:
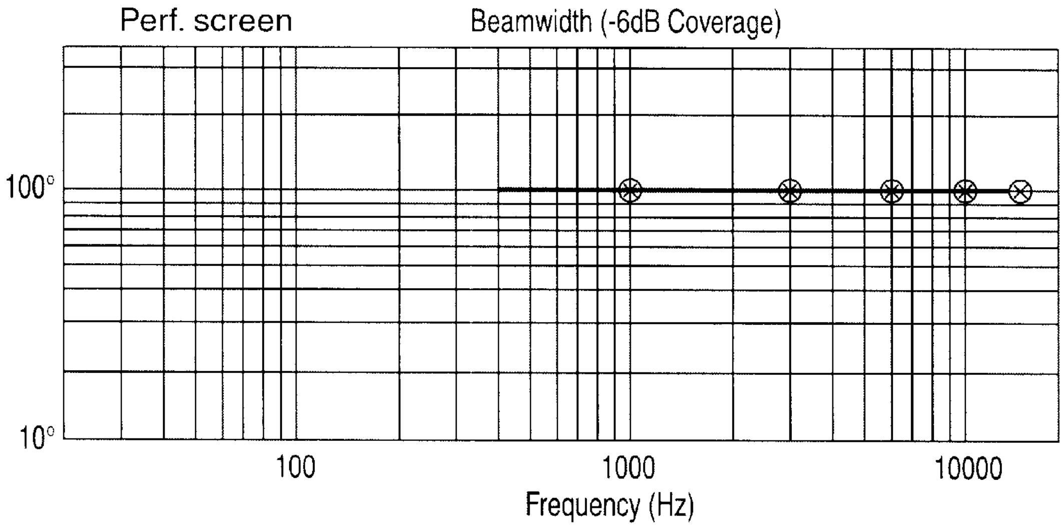
FIG. 5B is a graph showing the substantially constant horizontal beamwidth at −6 dB coverage as targeted for the high-frequency module of the cinema loudspeaker embodiment of the present invention as in FIG. 5A, as would be measured with the loudspeaker deployed behind a perforated cinema screen.

FIG. 5B is a graph showing target horizontal beamwidth at −6 dB coverage as a function of frequency for the compensated high-frequency module 12 of the cinema loudspeaker embodiment 10 of the present invention as in FIG. 5A, but as would be measured with the loudspeaker deployed behind a perforated cinema screen. The desired response is substantially constant horizontal beamwidth at −6 dB coverage, over the frequency range up to 16 kHz, as shown: in this example, a horizontal beamwidth of 100 degrees.

FIG. 6 presents the mathematical basis of the waveguide wall shape in the midrange module 14 and high-frequency module 12 of the cinema loudspeaker array embodiment of the present invention.

Figure 7A:
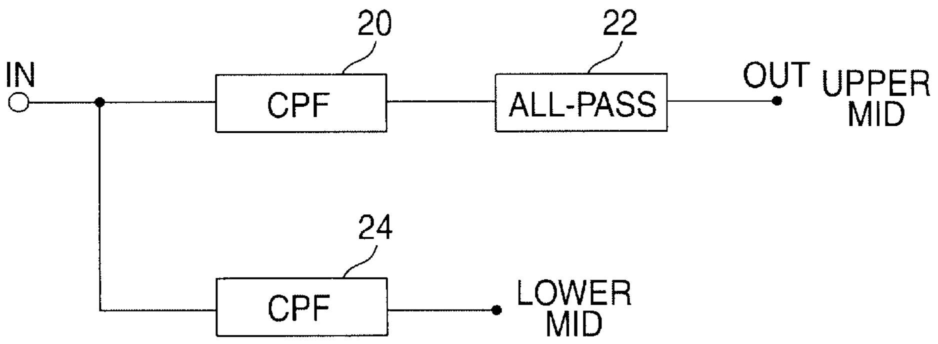
FIG. 7A is a functional block diagram of the filtering network for the transducer driver elements of the midrange module of the cinema loudspeaker array embodiment of the present invention.

FIG. 7A is a functional block diagram of the filtering network for the transducer driver elements 14A–D of the midrange module 14 of the cinema loudspeaker array embodiment 10 of the present invention.

Figure 7B:
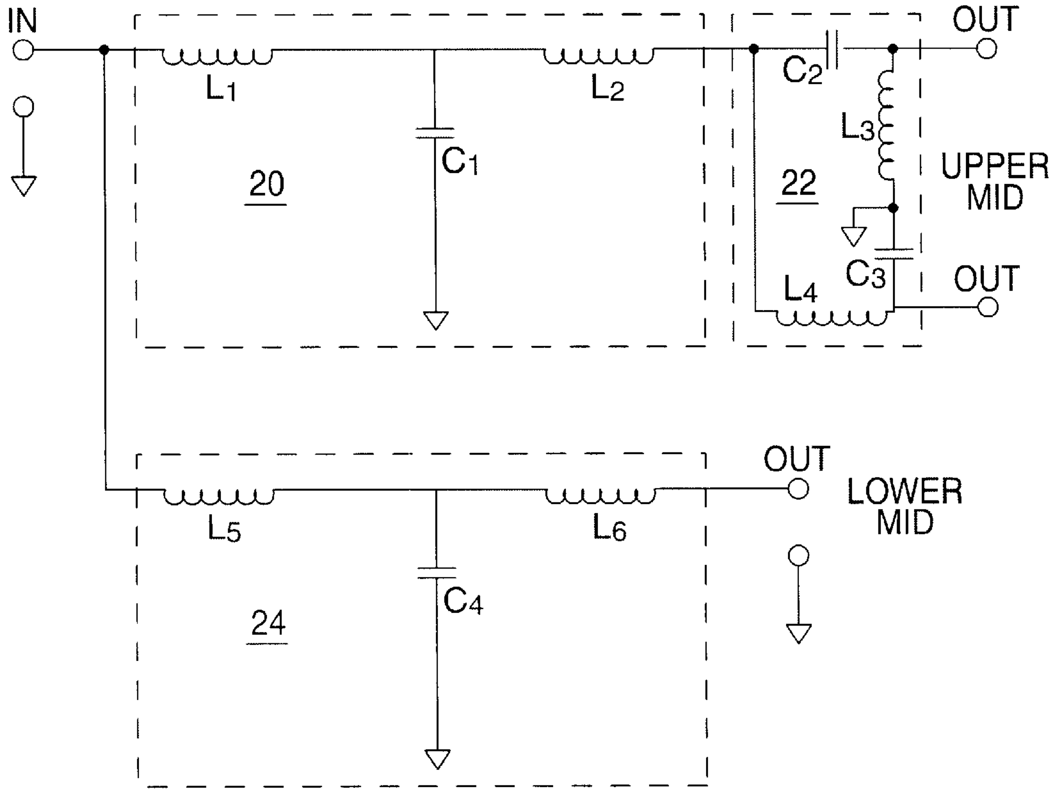
FIG. 7B is a schematic diagram of a passive circuit implementation of the filtering network of FIG. 7A.

FIG. 7B is a schematic diagram of a passive circuit implementation of the filtering network of FIG. 7A. Low pass filters 20 and 24 are implemented by L1, L2 and C1 and L5, L6 and C4 respectively, each in a T configuration. All-pass filter 22 is shown implemented by two series voltage divider branches: C2, L3,and L4, C3 returned to common ground as shown. All-pass filter 22 could alternatively be implemented by a delay line (digital or analog) optionally implemented at low signal level followed by power amplification: this implementation could also be accomplished totally or in part by the physically location of the appropriate transducer driver element with regard to setback from the front plane of the enclosure and the other elements.

Figure 8A:
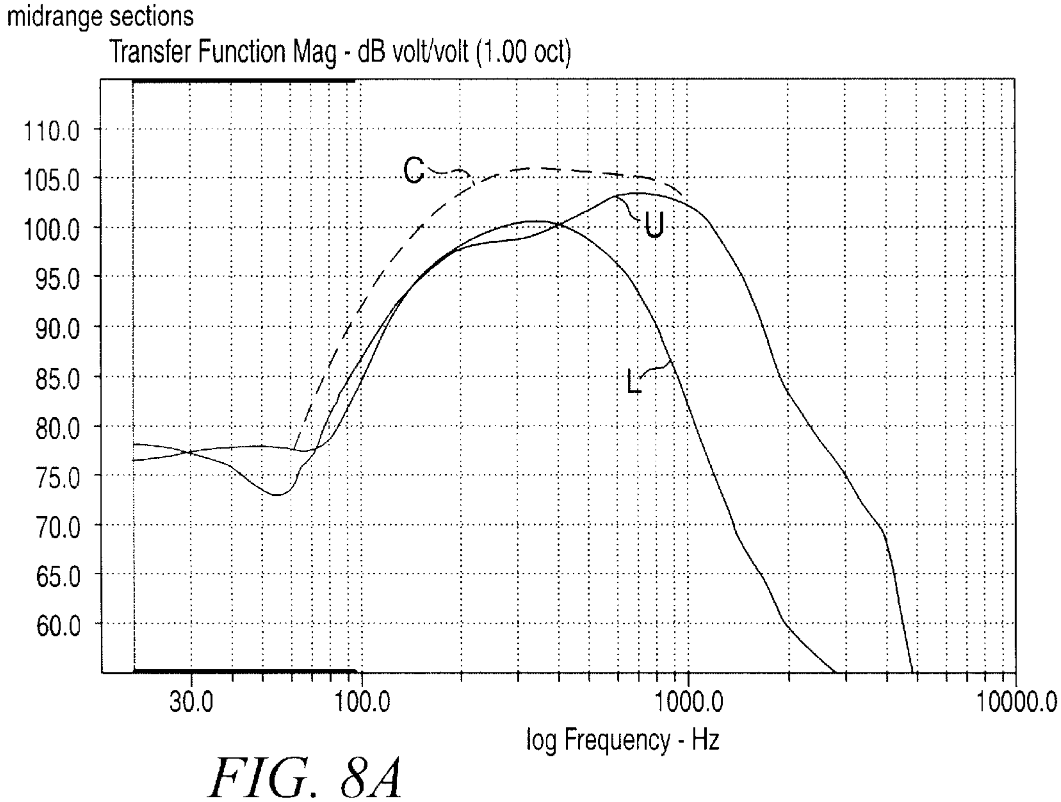
FIG. 8A is a graph with curves showing electro-acoustic magnitude/frequency response transfer functions of the lower and upper frequency drivers and their combined response as provided by the filtering network of FIG. 7B in combination with the mid-range loudspeaker module of the cinema loudspeaker array embodiment of the present invention.

FIG. 8A is a graph showing magnitude versus frequency response curves of the electrical-to-acoustic transfer functions of the lower and upper frequency drivers provided by the filtering network of FIG. 7B in combination with the mid-range loudspeaker module 12 of the cinema loudspeaker array embodiment 10 of the present invention. Curve U for the upper midrange drivers 14A and 14B shows a −6 dB cutoff frequency of about 1.4 kHz, while curve L for the lower midrange drivers 14C and 14D shows a cutoff frequency of about 700 Hz. The combined curve C, shown as a dashed line, indicates a 6dB bandpass from about 160 Hz to 1.3 kHz, and the dashed curve showing the overall response as the combination of curves U and L, showing the −6 dB bandwidth of the midrange portion extending from 150 Hz to 1.2 kHz.

Figure 8B:
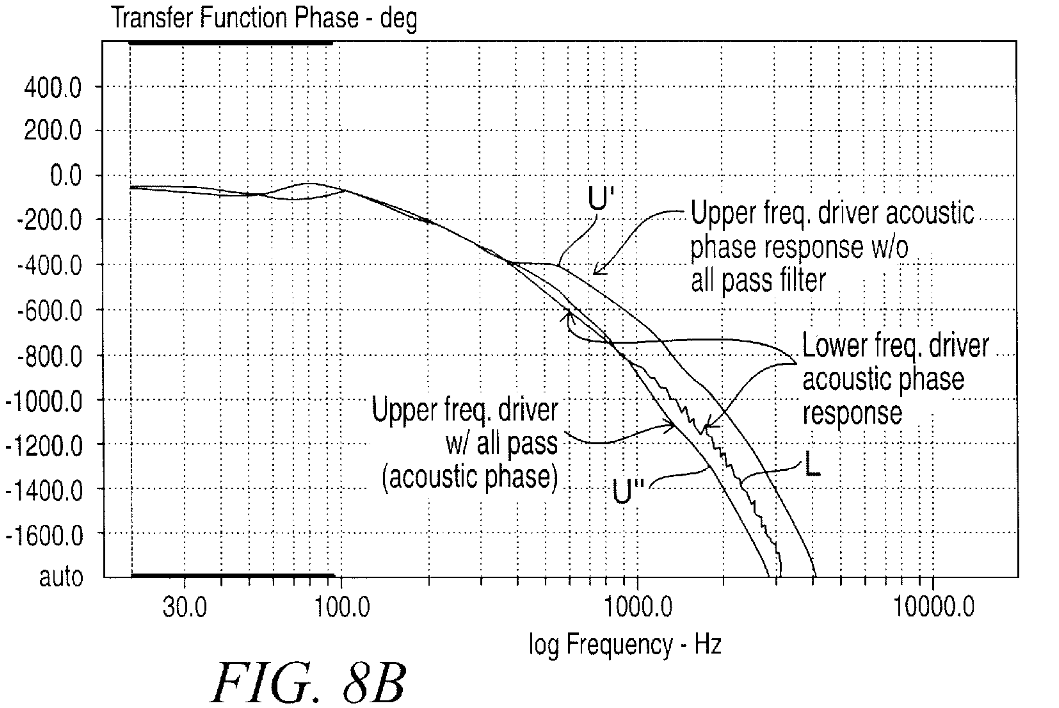
FIG. 8B is a graph with curves showing the corresponding phase transfer function of the functions shown in FIG. 8A.

FIG. 8B is a graph showing the corresponding phase transfer function of the function shown in FIG. 8A. Curve U' shows the upper driver acoustic phase response without the all pass filter 22; curve U" shows the upper driver acoustic phase response with the all-pass filter 22. Curve L shows the lower frequency driver acoustic phase response.

Figure 9A:
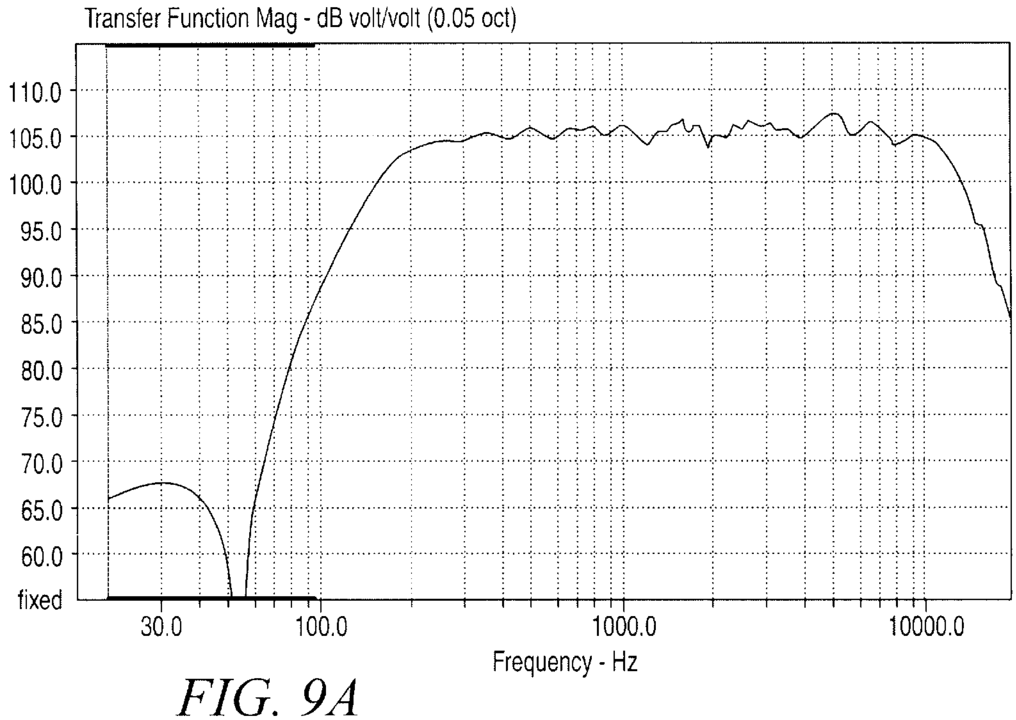
FIG. 9A is a graph with a curve showing the overall electro-acoustic magnitude/frequency transfer function of the combined mid-range and high-frequency modules of the cinema loudspeaker array embodiment of the present invention.

FIG. 9A is a graph showing the overall electro-acoustic magnitude/frequency response in half-space, i.e. 2 pi steradians solid included angle, for the combined midrange module 14 and high-frequency module 12 of the cinema loudspeaker array embodiment 10 of the present invention.

Figure 9B:
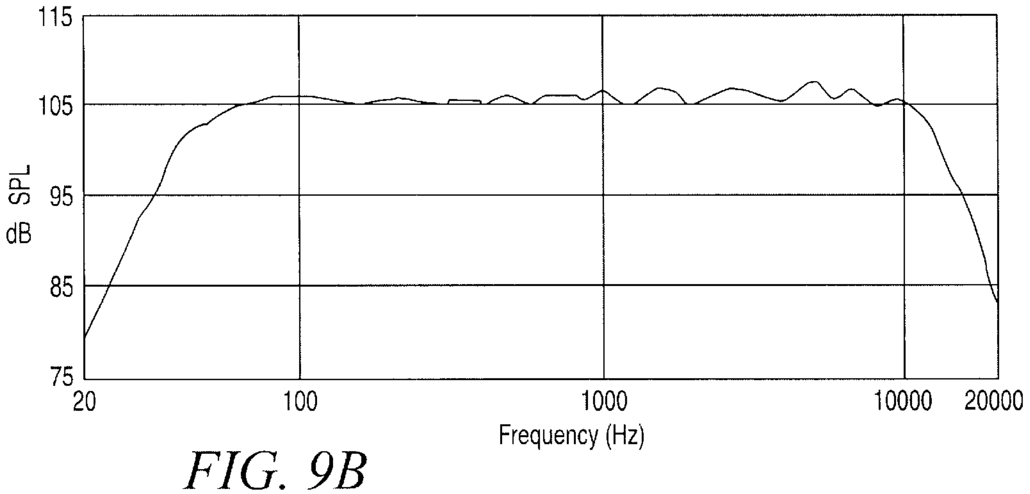
FIG. 9B is a graph with a curve showing the overall electro-acoustic magnitude/frequency transfer function of the combined low-frequency, midrange and high-frequency modules of the cinema loudspeaker array embodiment of the present invention.

FIG. 9B is a graph showing the overall electro-acoustic magnitude/frequency response in half-space (2 pi) for the total cinema loudspeaker array embodiment 10 of the present invention, including the low-frequency module 16, midrange module 14 and high-frequency module 12 deployed together.

In the graphs of FIGS. 10A through 10E and 11A through 11J, the curves shown are taken in a free-field environment with no cinema screen present.

Figure 10A:
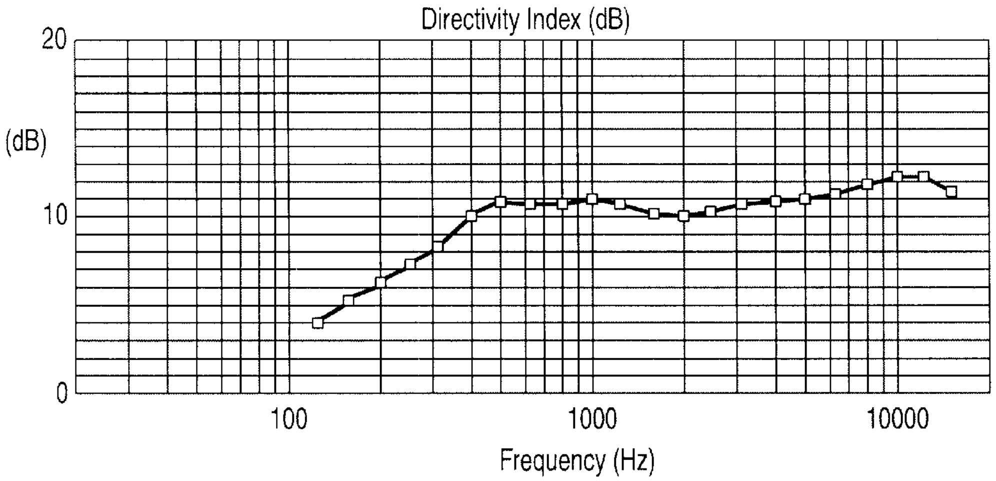
FIG. 10A is a graph with a curve showing directivity index measured on the combined low-frequency, midrange and high-frequency modules of the cinema loudspeaker array embodiment of the present invention.

In the graph of FIG. 10A, the curve shows directivity index measured on the combined midrange module 14 and high-frequency module 12 of the cinema loudspeaker array embodiment of the present invention.

Figure 10B:
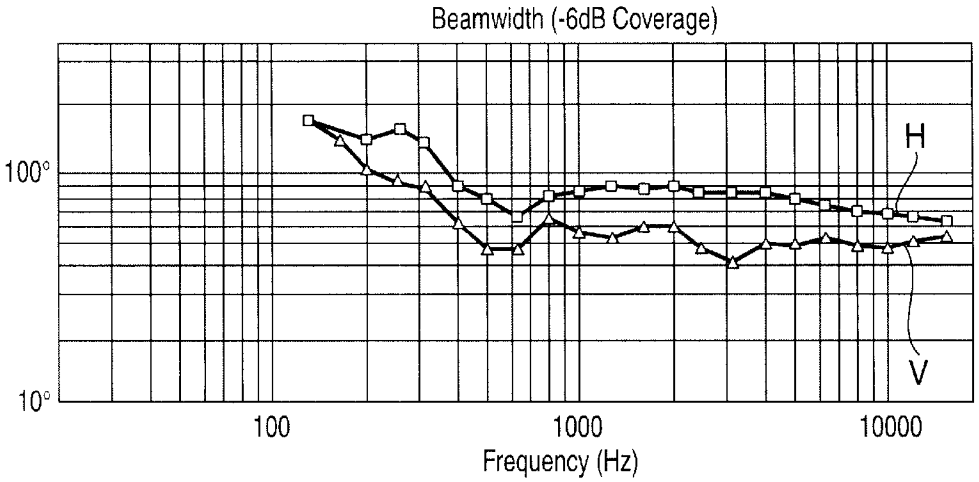
FIG. 10B is a graph with curves showing horizontal and vertical beamwidth as measured on the combined low-frequency, midrange and high-frequency modules of the cinema loudspeaker array embodiment of the present invention, corresponding to the directivity index shown in FIG. 10A.

In the graph of FIG. 10B, curve H shows horizontal beamwidth and curve V shows vertical beamwidth at −6 dB coverage measured on the combined midrange module 14 and high-frequency module 12 of the cinema loudspeaker array embodiment of the present invention.

Figure 10C:
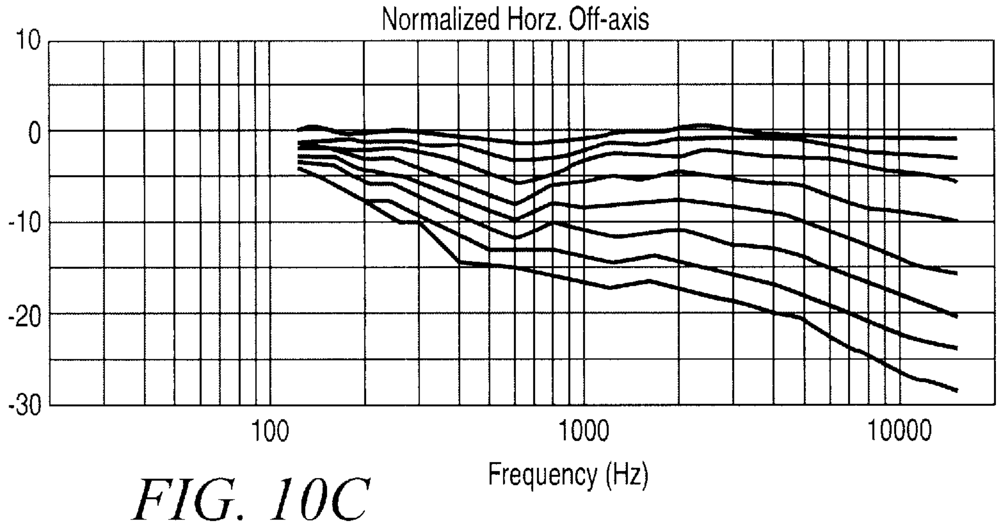
FIGS. 10C–E are graphs with families of curves showing normalized horizontal, vertical up and down responses measured on the combined midrange and high-frequency modules of the cinema loudspeaker array embodiment of the present invention.

FIG. 10C is a graph with a family of curves showing normalized horizontal response measured on the combined midrange module 14 and high-frequency module 12 of the cinema loudspeaker array embodiment 10 of the present invention.

Figure 10D:
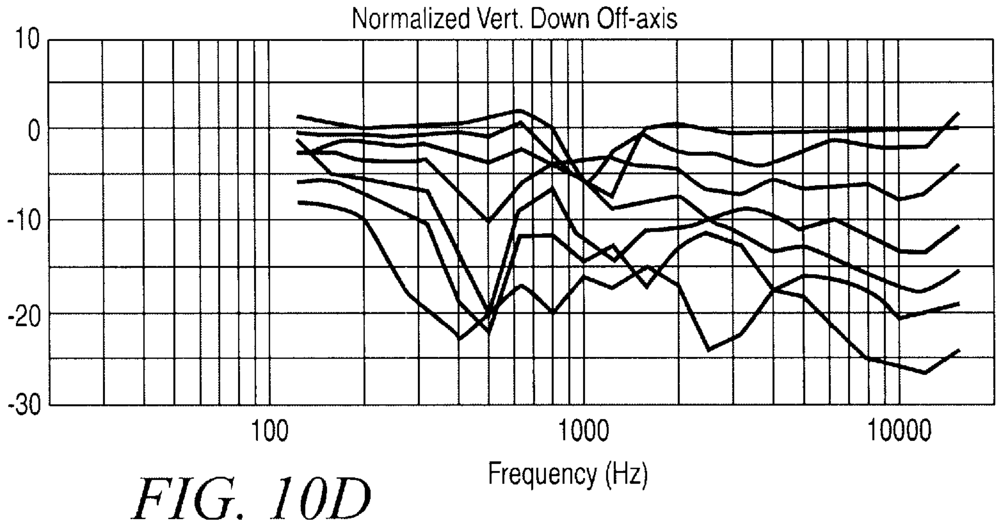

FIG. 10D shows the normalized vertical down off-axis response measured on the combined midrange module 14 and high-frequency module 12 of the cinema loudspeaker array embodiment 10 of the present invention.

Figure 10E:
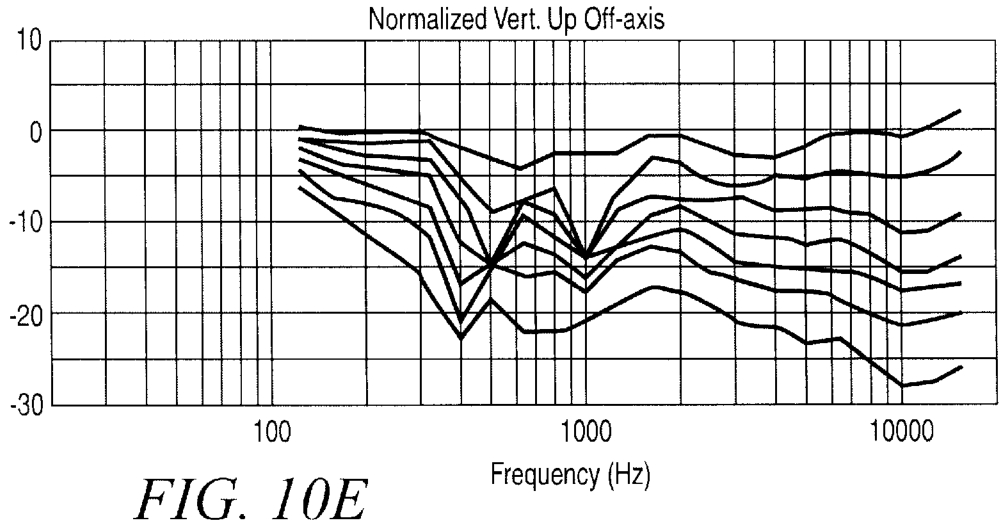

FIG. 10E shows the normalized up off-axis response measured on the combined midrange module 14 and high-frequency module 12 of the cinema loudspeaker array embodiment 10 of the present invention.

Figure 11A:
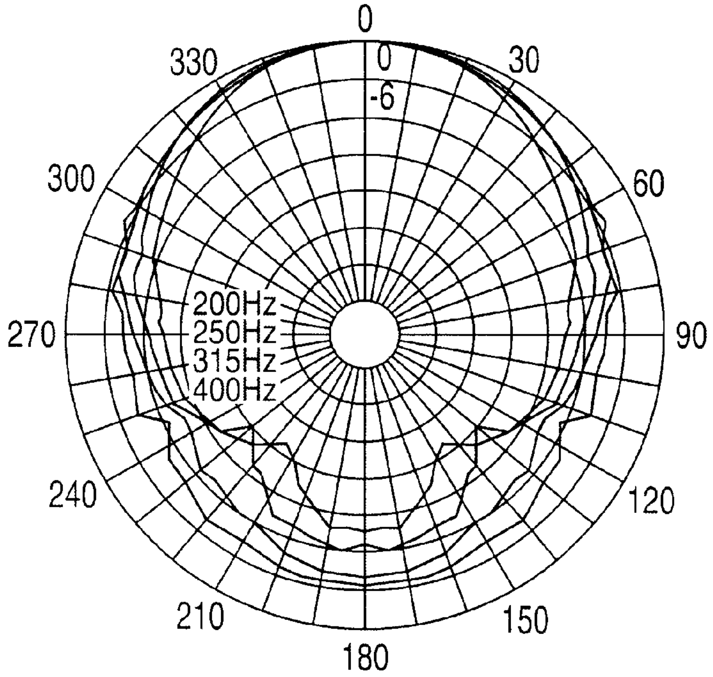
FIGS. 11A–B are polar graphs showing the midrange horizontal directivity of the cinema loudspeaker array embodiment of the present invention.
Figure 11B:
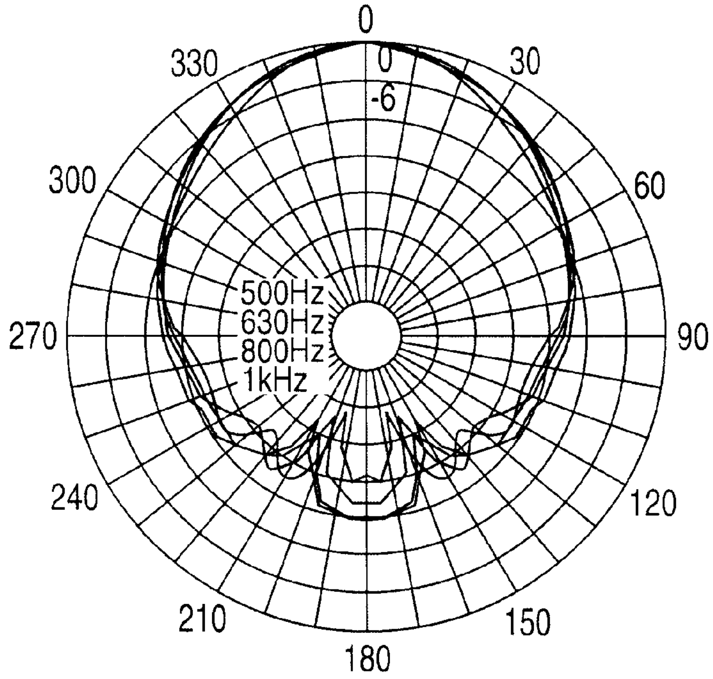

FIGS. 11A–B are polar graphs showing the midrange horizontal directivity of a loudspeaker array embodiment 10 of the present invention as in FIGS. 1A–3, measured at eight ⅓ octave frequency ranges from 200 through 1 kHz, with no screen deployed. Each radial step is 6 dB magnitude as indicated, so the −6 dB beamwidth in degrees of each curve is indicated by the two crossings of the −6 dB circle by each curve.

Figure 11C:
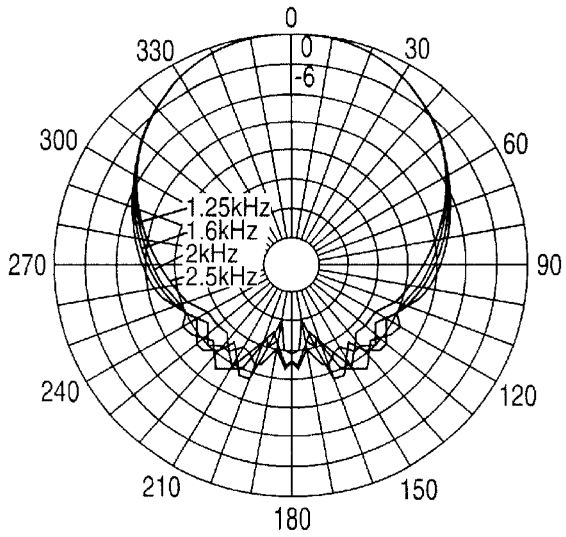
FIGS. 11C–E continue from FIGS. 11A–B, showing the high-frequency horizontal directivity.
Figure 11D:
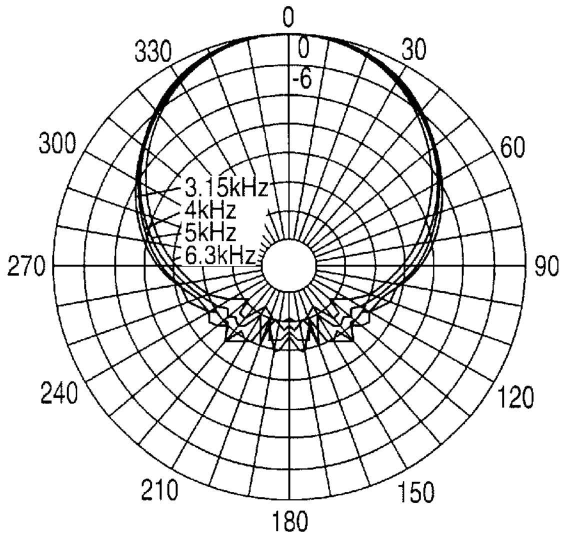
Figure 11E:
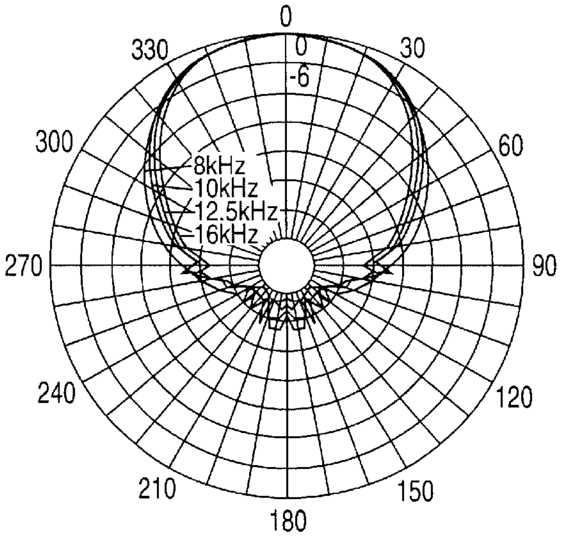

FIGS. 11C–E continue from FIGS. 11A–B showing the high-frequency horizontal directivity at twelve ⅓ octave frequency ranges from 1.25 kHz though 16 kHz, with no screen deployed.

Figure 11F:
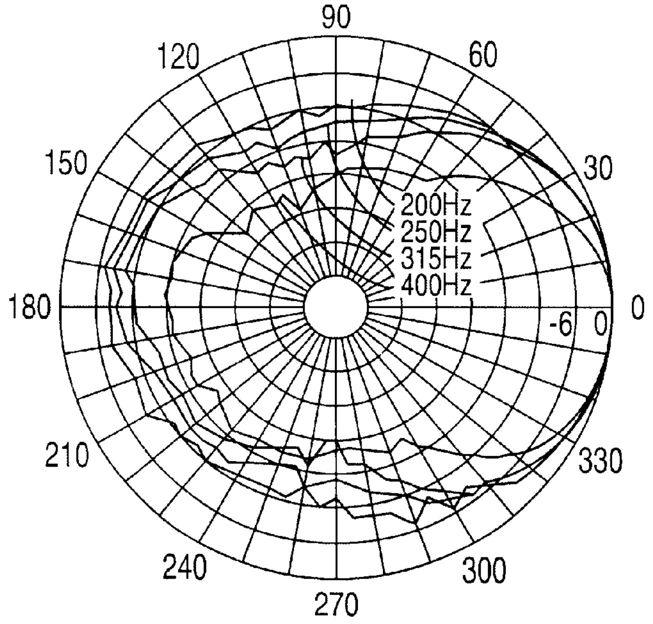
FIGS. 11F–G correspond to FIGS. 11A–B, showing the midrange vertical directivity.
Figure 11G:
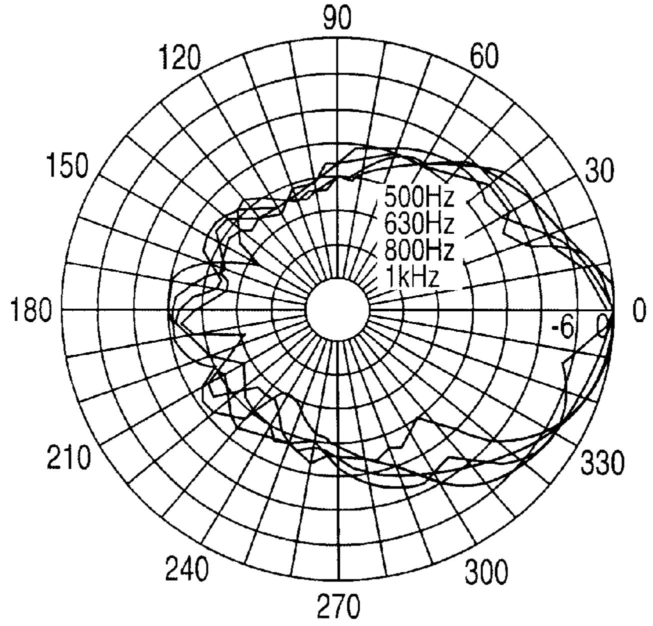
Figure 11H:
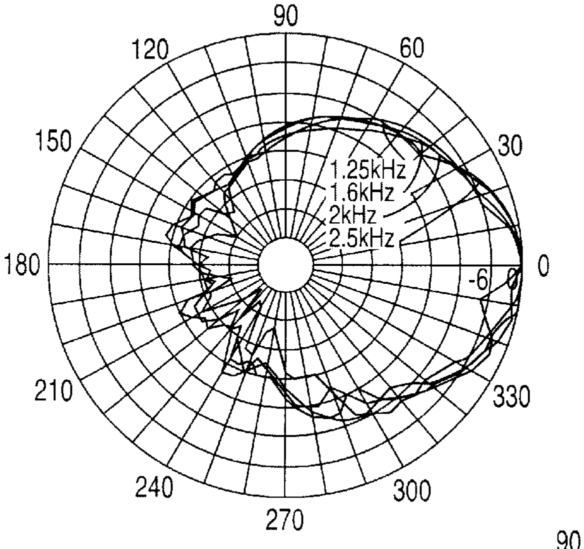
FIGS. 11H–J correspond to FIGS. 11C–E, showing the high-frequency vertical directivity.
Figure 11I:
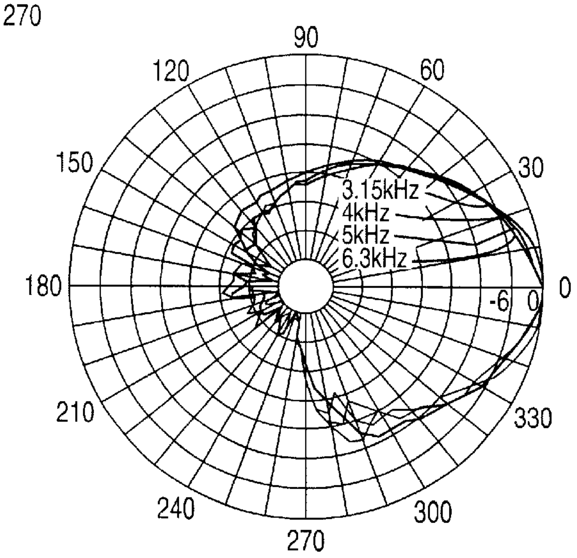
Figure 11J:
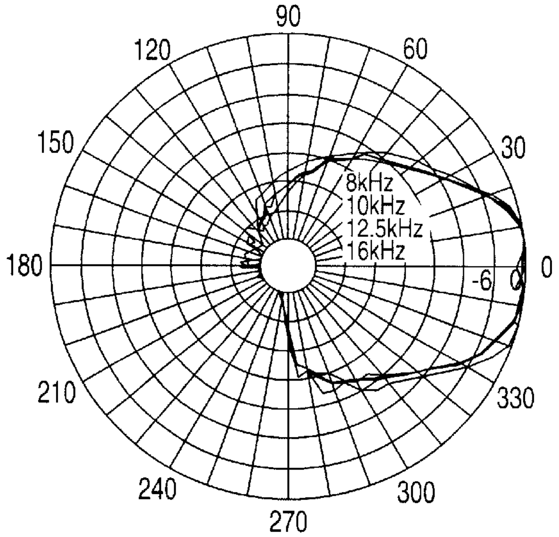

FIGS. 11F–G show the midrange vertical directivity, and FIGS. 11H–J show the high-frequency vertical directivity, corresponding to FIGS. 11A–B and 11C–E respectively.

The effect of the 5 degree downward aiming of the drivers is evident in FIGS. 11F–J, and the high-frequency compensation for screen spreading is evident in FIG. 11J.

The tilt angle A in the high-frequency module 12, the tilt angle B in the midrange module 14, and the value of the upwardly converging angle C (FIG. 4B), the asymmetry of the upper and lower waveguide walls 24B and 24C (FIG. 4A) and the symmetry of sidewalls 10G and 10H as shown in the illustrative embodiment are subject to "fine-tuning" variations for particular circumstances and objectives, that can be practiced within the scope of the invention.

A key aspect the invention, i.e. compensating a loudspeaker for screen spreading at high-frequency by configuring the high-frequency waveguide in a manner to narrow the beamwidth with increasing frequency, may be implemented with alternative shaping of the waveguide that may yield equivalent results, i.e. directivity that increases with frequency at the high end.

The invention could be practiced with a different quantity of acoustic driver units in any or all of the three modules, and these could driven by electrical signals distributed selectively in groups or individually.

This invention may be embodied and practiced in other specific forms without departing from the spirit and essential characteristics thereof. The present embodiments therefore are considered in all respects as illustrative and not restrictive. The scope of the invention is indicated by the appended claims rather than by the foregoing description. All variations, substitutions, and changes that come within the meaning and range of equivalency of the claims therefore are intended to be embraced therein.

What is claimed is:

1. A full-range loudspeaker system to project through a perforated cinema screen, the loudspeaker system comprising:

a high-frequency loudspeaker module having a compression driver coupled acoustically and mechanically to a high-frequency acoustic waveguide, where the high-frequency acoustic waveguide includes means for compensating for any horizontal beam-spreading caused by the perforated cinema screen;

a midrange loudspeaker module containing an acoustic midrange waveguide having (a) a throat portion driven by a plurality of cone-type midrange loudspeaker units, (b) a mouth portion formed by peripheral front edges of the midrange loudspeaker module, and (c) a cross-sectional shape, taken perpendicular to a central axis of the acoustic midrange waveguide, that increases in area continuously from the throat portion to the mouth portion; and a low-frequency loudspeaker module having an enclosure containing a plurality of cone-type low-frequency loudspeaker units, configured to provide predetermined sound coverage in a predetermined auditorium area within a designated low-frequency range, where each of the three modules are positioned to co-operate together with the other two modules.

2. The full-range loudspeaker system of claim 1 where the midrange loudspeaker is configured to output acoustic sound within a crossover frequency range having an upper crossover frequency of approximately 1.5 kHz and a lower crossover frequency of approximately 250 Hz.

3. The full-range loudspeaker system of claim 1 further comprising filter circuitry in the midrange loudspeaker module that is configured to act on audio signals applied to the cone-type midrange loudspeaker units to provide substantially constant vertical beamwidth over the mid-frequency range and to provide smooth crossover performance in co-operation with the high-frequency loudspeaker module.

4. The full-range loudspeaker system of claim 3 where the cone-type midrange loudspeaker units are divided into a first electrical drive portion and a second electrical drive portion, and where the filter circuitry comprises a filter network configured to provide an operating bandwidth for the first electrical drive portion that extends throughout the mid-frequency range, and to provide a different narrower operating bandwidth for the second electrical drive portion that extends from the lower crossover frequency to an upper cutoff frequency, where the upper cutoff frequency is substantially lower in frequency than the upper crossover frequency to create a substantially constant vertical beamwidth throughout the mid-frequency range.

5. The full-range loudspeaker system of claim 4 where the three modules are stacked in a vertical column with the low-frequency loudspeaker module at bottom, the mid-frequency loudspeaker module in a mid-region and the high-frequency loudspeaker module on top, where the plurality of midrange cone-type loudspeaker units comprises four midrange cone-type loudspeaker units arranged in a vertical column, two of the four being deployed in the first electrically driven portion and the other two being deployed in the second electrically driven portion, and where the upper crossover frequency is approximately 1.5 kHz, the lower crossover frequency is approximately 250 Hz, and the upper cutoff frequency of the second portion is approximately 700 Hz.

6. The full-range loudspeaker system of claim 5 where the two midrange cone-type loudspeakers of the first electrically driven portion are positioned in the column above the other two of the second electrically-driven portion.

7. The full-range loudspeaker system of claim 1 where the three modules are sized to substantially conform to a width dimension and to a depth dimension that do not exceed eighteen inches, and are stacked in a vertical column with the low-frequency loudspeaker module at bottom, the mid-frequency loudspeaker module in a mid-region, and the high-frequency loudspeaker module on top.

8. The full-range loudspeaker system of claim 1 where the high-frequency loudspeaker module is configured with four peripheral front edges defining a horizontally-elongated rectangular sound exit end shape disposed in a substantially vertical plane, and where the horn shape is made to be vertically asymmetric such that, with the loudspeaker system oriented with a frontal plane thereof disposed substantially vertically, a forward-directed central axis of the compression driver and of the horn shape are made to aim in a direction that is offset from horizontal by a predetermined angle.

9. The full-range loudspeaker system of claim 8 where the forward-directed central axis of the compression driver and of the horn shape are made to aim in a direction that is offset downwardly from horizontal by an angle of approximately 5 degrees nominal.

10. The full-range loudspeaker system of claim 1 where the acoustic high-frequency waveguide is configured with a throat portion, originating at a driven sound entry end, flaring smoothly to a mouth portion extending to a sound exit end corresponding with a vertical front plane of the module, and is configured to have an to internal shape characterized by:

a cross-sectional shape, taken at the sound entry end of the throat portion, that is substantially circular;

a transitional cross-sectional shape, taken at a transitional plane located parallel with the front plane and displaced a predetermined setback distance therefrom, that is made to be horizontally-elongated and generally rectangular in shape with rounded corners, having greater width in a bottom region thereof than in top region thereof, thus forming an inverted keystone shape deriving from the downward angle of inclination of the central axis;

a frontal shape of the sound exit end of the mouth portion at the front plane, that is made to be generally rectangular and horizontally-elongated with rounded corners; and an overall internal shape that transitions smoothly from the sound entry end, through the transitional plane, to the sound exit end at the front plane.

11. The full-range loudspeaker system of claim 1 where the midrange loudspeaker module further comprises:

a plurality of mounting baffles arrayed in a vertical column, each supporting one of the cone type midrange loudspeaker units operationally mounted on a rear side and directed through an opening configured in the mounting baffle into a corresponding individual waveguide throat region that is one of a plurality contained in the throat region of the midrange waveguide, each mounting baffle being inclined so as to aim the corresponding midrange loudspeaker unit in a direction that is offset from horizontal by a predetermined angle.

12. The full-range loudspeaker system of claim 11 where the midrange loudspeaker module comprises four cone type midrange loudspeaker units, and where the mounting baffle is inclined to aim the corresponding midrange loudspeaker unit in a direction that is offset downwardly from horizontal by an angle of 5 degrees nominal.

13. The full-range loudspeaker system of claim 12 where midrange loudspeaker module further comprises filter circuitry configured to act on audio signals applied to the cone-type midrange loudspeaker units in a manner to provide substantially constant vertical beamwidth over the mid-frequency range and smooth crossover performance in co-operation with the high-frequency loudspeaker module, the filter circuitry comprising;

a first filter network configured to provide an operating bandwidth for the upper two midrange cone-type loudspeaker units extending from the lower crossover frequency to the upper crossover frequency;

a second filter network configured to provide an operating bandwidth for the lower two midrange cone-type loudspeaker units that extends from the lower midrange crossover frequency to a designated frequency substantially lower than the upper crossover frequency as required to accomplish substantially constant vertical beamwidth throughout the mid-frequency range.

14. The full-range loudspeaker system of claim 13 where the lower crossover frequency is approximately 250 Hz, the upper cutoff frequency of the second filter network is approximately 700 Hz, and the upper crossover frequency is approximately 1.5 kHz.

15. The full-range loudspeaker system of claim 1, where the compression driver of the high-frequency loudspeaker module comprises a sound axis, and where the high-frequency acoustic waveguide comprises, as the means for compensating for any horizontal beam-spreading caused by the perforated cinema screen, a horn attached at a first end to the driver and forms an opening at a second end, the horn comprising a top wall having a top interior surface, a first side wall having a first side wall interior surface, a second side wall having a second side wall interior surface, and a bottom wall having a bottom interior surface separated from the top interior surface by first side wall and the second side wall, where an angle of declination of the bottom interior surface from the sound axis is greater an angle of inclination of the top interior surface from the sound axis to define a central vertical axis of the horn that declines from the sound axis at an angle A, and where each of the first side wall and the second side wall is bowed towards one another and are inclined with respect to one another at an angle C, where the angle C is wider at the bottom wall than at the top wall.

16. In a full-range loudspeaker system to project through a perforated cinema screen, a high-frequency loudspeaker comprising:

a driver having a sound axis; and a horn attached at a first end to the driver and forms an opening at a second end, the horn comprising a top wall having a top interior surface, a first side wall having a first side wall interior surface, a second side wall having a second side wall interior surface, and a bottom wall having a bottom interior surface separated from the top interior surface by first side wall and the second side wall, where an angle of declination of the bottom interior surface from the sound axis is greater an angle of inclination of the top interior surface from the sound axis to define a central vertical axis of the horn that declines from the sound axis at an angle A, and where each of the first side wall and the second side wall is bowed towards one another and are inclined with respect to one another at an angle C, where the angle C is wider at the bottom wall than at the top wall.

17. The high-frequency loudspeaker of claim 16, where each of the first side wall and the second side wall is symmetrical about the sound axis in a vertical direction and each diverges in a smooth curve from the driver to the opening at the second end.

18. The high-frequency loudspeaker of claim 16, where the interiors of the top wall, the first side wall, the second side wall, and the bottom wall extend to a vertical transition plane located at approximately 90% from the first end of the horn and where the horn further smoothly transitions outward from the vertical transition plane to the second end of the horn.

19. The high-frequency loudspeaker of claim 16, where the angle A is approximately five degrees.

* * * * *